United States Patent [19]

Bouix et al.

[11] Patent Number: 4,859,503
[45] Date of Patent: Aug. 22, 1989

[54] PROCESS FOR COATING CARBON FIBERS WITH A CARBIDE, AND CARBON FIBERS THUS COATED

[75] Inventors: Jean Bouix, Lyon; Jean C. Viala, Villeurbanne; Henri Vincent; Christiane Vincent, both of Lyon; Jean L. Ponthenier, Champagne au Mont D'Or; Jacques Dazord, Villeurbanne, all of France

[73] Assignee: Central National De La Recherche Scientifique (CNRS), France

[21] Appl. No.: 128,333

[22] Filed: Dec. 2, 1987

[30] Foreign Application Priority Data

Dec. 4, 1986 [FR] France ................................ 86 17157

[51] Int. Cl.⁴ .......................... B32B 9/00; D02G 3/00
[52] U.S. Cl. .................................. 427/249; 427/255.2; 427/255.4; 427/255.5; 427/52; 428/253; 428/260; 428/262; 428/368; 428/367; 428/378; 428/379; 428/389; 428/408
[58] Field of Search ................ 427/249, 255.2, 255.4, 427/255.5, 52; 428/253, 260, 262, 368, 367, 378, 379, 389, 408

[56] References Cited

U.S. PATENT DOCUMENTS

| | | |
|---|---|---|
| 3,369,920 | 2/1968 | Bourdeau et al. .................. 427/249 |
| 3,679,475 | 7/1972 | Basche et al. ..................... 427/255.5 |
| 3,811,940 | 5/1974 | Douglas et al. ...................... 427/52 |
| 3,860,443 | 1/1975 | Lachman et al. ................... 427/249 |
| 3,897,542 | 7/1975 | Economy et al. .................. 423/440 |
| 3,903,323 | 9/1975 | Galasso et al. ...................... 427/249 |
| 4,180,428 | 12/1979 | Riley et al. .......................... 427/249 |
| 4,275,095 | 6/1981 | Warren .............................. 427/255.5 |
| 4,315,968 | 2/1982 | Suplinskas et al. ............. 427/255.5 |
| 4,343,836 | 8/1982 | Newkirk et al. ..................... 427/249 |
| 4,591,514 | 5/1986 | Holzl .................................. 427/249 |
| 4,668,579 | 5/1987 | Shangman et al. ................. 427/249 |

Primary Examiner—Norman Morgenstern
Assistant Examiner—Sadie Childs
Attorney, Agent, or Firm—Wall and Roehrig

[57] ABSTRACT

A process for continuously coating a strand of continuous carbon filaments by means of a refractory carbide by reactive CVD deposition, which includes the step of causing the strand to travel under mechanical tension with a hermetic enclosure, simultaneously, introducing into the said enclosure a gas mixture consisting of hydrogen and of a volatile compound of an element capable of forming a refractory carbide; and heating the reaction mixture consisting of the strand and the gas mixture so that the formation of the carbide deposit on the filaments takes place by a chemical reaction between the carbon in these filaments and the gas mixture; and the reaction is self-regulated by the diffusion of carbon through the layer of carbide already formed.

3 Claims, 1 Drawing Sheet

PROCESS FOR COATING CARBON FIBERS WITH A CARBIDE, AND CARBON FIBERS THUS COATED

BACKGROUND OF THE INVENTION

The invention relates to a process for coating carbon fibers with a refractory carbide; it also relates to the carbon fibers thus coated.

The manufacture of composite materials by reinforcing light metals such as aluminum, magnesium, titanium, or ceramic by using ceramic fibers is known in the art.

While the use of silicon carbide, boron or alumina fibers can yield excellent results from the standpoint of mechanical performance, nevertheless, the very high price of these fibers considerably limits their development.

The use of carbon fibers has heretofore been suggested. Unfortunately, the chemical compatibility of these fibers with a metal matrix is poor. In point of fact, when this type of composite is fabricated or employed, it has a troublesome tendency to undergo chemical reactions whereupon metal carbides are formed, which considerably degrade the properties of the composite.

In order to overcome these disadvantages, it has been proposed, therefore, to protect these carbon fibers with a coating which would then withstand the chemical action of the metal. It has thus been suggested to coat these fibers with a chemical deposit produced from a vapor phase of a refractory compound such as a titanium boride, nitride or carbide or a silicon or boron carbide.

This vapor phase deposition, referred to by the American acronym CVD (chemical vapor deposition), does not make it possible to obtain good protection of each of the elementary filaments of which the strand of carbon fibers consists. It is very difficult, if not impossible, in fact, to avoid preferential deposition, particularly on the peripheral regions of the strands, and also to avoid the welding of the filaments to each other. These disadvantages make this process unusable on an industrial scale.

In other words, the CVD technique, although theoretically highly attractive, does not make it possible to control the thickness and the homogeneity of the protective coating, especially when, as in a strand, the gaseous reaction medium does not diffuse well to the core. As a result, the individual carbon filaments are not coated homogeneously or uniformly to a controlled thickness.

In their communication, published in CVD V Conference Proceedings (1975) p. 623 to 633, Warren and Carlson described a process for coating titanium carbide onto carbon fibers by means of reactive CVD in a heated hermetic enclosure wherein a gas phase containing titanium chloride is used in the presence of hydrogen. This direct reaction, in which carbon is contributed by the fiber itself, can be written:

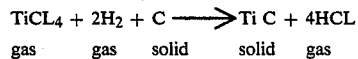

$$TiCL_4 + 2H_2 + C \longrightarrow TiC + 4HCL$$
$$\text{gas} \quad \text{gas} \quad \text{solid} \quad \text{solid} \quad \text{gas}$$

Unfortunately, this theoretical process has seen no industrial follow-up, despite the long period which has elapsed since it became known and despite the increasingly pressing requirement and need to produce carbon fibers coated with a refractory carbide. It is firstly a noncontinuous process which takes a long time to implement resulting in very thick carbide deposits on the order of one micron. The mean diameter of the fibers is approximately seven microns. This makes these fibers brittle and, in most cases, the fibers are welded together. Briefly, this prior art process cannot be employed to coat a strand of parallel carbon filaments in a homogeneous, uniform and controlled manner, as required for the manufacture of composite materials containing light metal matrices.

In British Patent 1,235,011, corresponding to French Patent FR-A-2,028,338, it has been proposed to deposit amorphous boron continuously onto a carbon monofilament by passing a heated monofilament through a gaseous atmosphere of hydrogen and boron halide. Heating of the monofilament is achieved by a Joule effect provided by two mercury seals which are responsible for feeding current and for sealing the enclosure. This solution is limited to the deposition of boron and does not enable a strand of parallel filaments to be coated. The strand which constitutes a porous medium, passes through the mercury and the metal is drawn into the reactor on the strand and reacts with the gas mixture, thus degrading the seal.

SUMMARY OF THE INVENTION

The invention overcomes these disadvantages. It provides a process for coating carbon filaments with a refractory carbide by direct CVD deposition which can be operated continuously, and by which it is possible to obtain a deposit which is adherent, homogeneous, uniform and of controlled thickness on each individual elementary filament without these filaments adhering together, so that these filaments can be easily spread out as a sheet.

This process for continuously coating a strand of carbon filaments by means of a refractory carbide by reactive CVD involves the steps of: (1) causing the strand to travel under mechanical tension in a hermetic enclosure; (2) simultaneously therewith introducing into the enclosure a gas mixture consisting of hydrogen and a volatile compound of an element capable of forming a refractory carbide; and (3) heating the reaction mixture consisting of the strand and the gas mixture, so that the formation of the carbide deposit on the filaments takes place by a chemical reaction between the carbon in these filaments and the gas mixture and the reaction is self-regulated by the diffusion of carbon through the layer of carbide that has formed.

In known CVD techniques all the elements necessary for the formation of a deposit are contributed by the gas phase. In the present invention it is the filaments themselves which, as they pass through the coating zone, contribute one of these elements, namely carbon. This difference is reflected in an adherent and homogeneous deposit, and a self-regulated deposition reaction.

Similarly, the invention is distinguished from the teachings of, the abovementioned British Patent 1,235,011 by the fact that resort is made to a reactive or nonconventional CVD and that the latter is applied to a strand of filaments and no longer to a monofilament.

Lastly, the invention is distinguished from the teachings of Warren and Carlson by the fact that the deposition is carried out continuously for a short time, which makes it possible to obtain supple filaments having outstanding mechanical characteristics.

BRIEF DESCRIPTION OF THE DRAWING

The way in which the invention may be implemented and the advantages which stem therefrom will be better appreciated from the examples of embodiments which follow and which are given by way of indication and without any limitation being implied, aided by the attached figures which show diagrammatically, in cross-section, a device according to the invention.

DETAILED DESCRIPTION OF THE INVENTION

Figure 1:
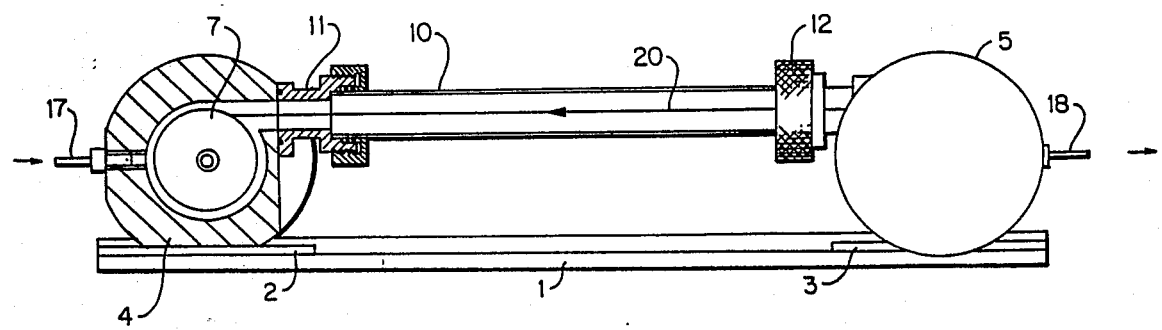
FIG. 1 is a diagrammatic view in lengthwise section of a plant (reactor) according to the invention.

In the practice of the present invention the positive mechanical tensioning of the strand is produced by unwinding and rewinding the strand over driving pulleys whose speed difference is regulated so as to produce a slight positive rewinding tension. The heating of the strand is produced by a Joule effect by applying a voltage to the driving pulleys. The pulleys are conductive and are placed in the reaction enclosure itself and not outside as in the abovementioned British patent. The volatile compound of an element capable of yielding a refractory carbide is chosen from the group comprising titanium, silicon, boron, tantalum, molybdenum, tungsten, hafnium and zirconium halides. In an alternative form, the gas mixture may also comprise hydrides, as well as derivatives of nitrogen or oxygen in order to produce carbonitrides or oxycarbides. Similarly, the gas mixture may consist of a mixture of volatile compounds of two or more metals which are different.

The temperature of the carbon filaments during the treatment is above 1,300° K., at least in the case of silicon or titanium carbide deposits; when this temperature is below 1200° K., the coating of the carbon filaments is insufficient in thickness to protect the strand. The temperature of the carbon filaments during the treatment must be lower than a limiting temperature which depends on the refractory carbide deposited. Excellent results are obtained at a temperature of about 1,800° K. when depositing silicon carbide. At higher temperatures, the filaments tend to become coated with crystals of different forms and on the order of several microns in size, whose presence embrittles the filaments and, promotes welding of the filaments to each other.

The partial pressure of the volatile compound of the element to be deposited in the form of carbide must be limited in the deposition reactor. In the case of a halide with a high saturation vapor pressure at ambient temperature (for example silicon chloride), it is recommended to cool the evaporator or to dilute the hydrogen-halide mixture with hydrogen or with an inert gas at the exit of the evaporator by maintaining this region at a constant temperature of about 298° K.

A hydrogen-rich reaction mixture promotes the conversion of the element forming the carbide, but can form carbide crystals of certain filaments of the strand. This is particularly true when a reaction mixture with a high partial pressure of halide is employed in the reactor. Consequently, it is preferable to entrain the halide by means of a carrier gas consisting of a hydrogen-argon mixture. Experience appears to show that the hydrogen/silicon tetrachloride ratio needs to be below 2.3. The reaction time is of the order of a minute; and the total pressure is atmospheric pressure.

The formation of the carbide deposit on the carbon filaments takes place by a chemical reaction between the gas phase and the carbon filaments themselves. This gives rise to a number of advantages. In places on the filament where a deposit has already formed, the carbon must diffuse through the carbide layer in order to react. This results in very slow reaction kinetics. The deposit therefore becomes self-regulating when it has reached only a few hundredths of a micron in thickness. This thickness can be varied by modifying the deposition conditions. Since the reaction is greatly slowed down as the deposit is formed on the filaments, the gas phase can continue to react on the bare parts of the filament. This results in a continuous and uniform deposit along the filament and, above all, penetrating of the gas reaction mixture to the core. That is to say, the gas comes in contact with all the filaments situated at the core of the strand. Until now, the gas reaction mixture could reach all the filaments only with great difficulty. Since the reaction requires the participation of the carbon filament, this reaction is limited to the surface of the filament. As a result, the reaction does not tend to form dendritic deposits or deposits on the reactor walls. This is not the case in the Warren and Carlson process referred to wherein such build-ups make this technique unusable on an industrial scale.

Furthermore, since the formation of the carbide coating originates from the carbon in the filament itself, the adhesion between this filament and the surface carbide is excellent. There is no discontinuity at the interface and therefore no tendency for the deposit to become detached.

To obtain these various advantages it is important for the reaction conditions (temperature, contact time, gas stream composition and flow rate) to be regulated so as to limit the formation of volatile carbon derivatives (methane) to avoid a nonreactive CVD process. These conditions vary as a function of the carbide which it is desired to deposit and they can be readily determined by a person skilled in the art.

Lastly, the invention relates to strands of individual parallel carbon filaments, coated in this manner. These strands comprise individual filaments of carbon which carry a refractory carbide coating, wherein the said carbide coating of each individual filament is homogeneous, adherent and uniform over the length of a single filament and from one filament to another throughout the cross-section of the strand, and of a constant thickness of between 0.01 and 0.1 micron.

As noted, if the deposit layer is too thin the carbon filament will not be protected effectively. If the thickness is too great, the mechanical properties of the filaments rapidly deteriorate and the filaments tend to become brittle and weld to each other as noted when following the teachings of Warren and Carlson. These filaments furthermore lack suppleness and is no longer possible to spread them out sufficiently during the metallizing operation that precedes the hot pressing for the manufacture of a composite material containing a metal matrix, or during any other method of fabrication of these composites.

Figure 2:
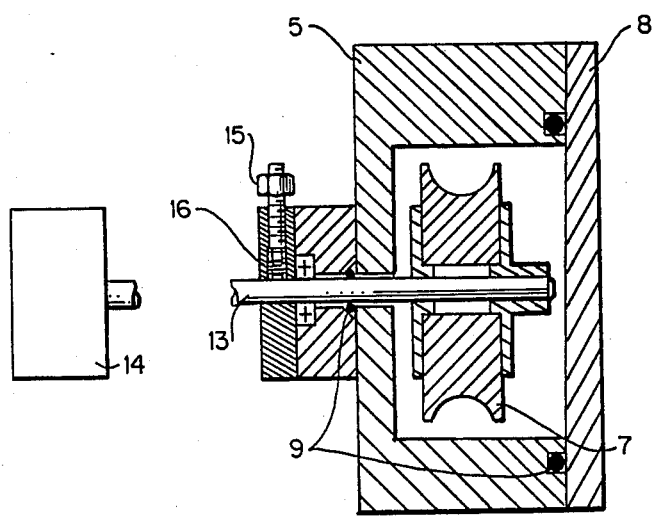
FIG. 2 is a sectional view of the rewinding reel along the plane II—II of FIG. 1.

As shown in the drawings, the two electrically insulating plates 2 and 3 are fastened onto a stainless steel support 1. On each plate 2,3 are placed the two blocks 4,5 housing the pulleys 7 shown in detail in FIG. 2. These blocks 4,5, which are also made of stainless steel, each has a flange 8 with a Viton seal 9 to allow the operations of loading and unloading of the strands These two blocks 4,5 are connected together by a cylindrical silica tube 10 coupled by means of sleeves 11,12 equipped with sealing rings.

Each block 4,5 contains a conductive pulley 7 mounted on a horizontal shaft 13 driven by a motor 14. The pulleys 7 are thus enclosed in the reaction enclosure.

Current supply is provided by a lug terminal 15, itself connected to the shaft 13 by virtue of a mercury seal 16.

A strand 20 of parallel carbon filaments is unwound between the two driving pulleys 7.

It is obvious that the treatment enclosure made up of parts 4, 5 and 10 is hermetic.

Lastly, the reaction mixture is introduced by virtue of an entry orifice 17, and the gases leave via an exit orifice 18. Preferably, the reaction mixture flows counterclockwise to the direction of forward travel of the strand 20.

In the examples below, use is made of a strand of carbon filaments consisting of 6,000 individual filaments seven microns in diameter and of approximately 400 dtex. These filaments are produced by pyrolysis of acrylic fibers. They received no oxidation treatment or sizing.

The invention will be further described with reference to the following examples.

EXAMPLE 1

The speed of travel of the strand 20 (FIG.1) is set to twenty meters per hour, while a slight mechanical tension is maintained.

A hydrogen/silicon tetrachloride/argon mixture is introduced into the reaction enclosure. The hydrogen/chloride volume ratio is 0.25. The total gas flow rate is fixed at 10.2 liters per hour. The temperature of the strand being treated is maintained at 1600° K., by regulation of the electrical supply voltage.

Throughout this treatment, the mechanical tension of the strand 20, is slightly positive in order to avoid undulations.

The treatment time is approximately one and one half minutes.

A strand in which all the carbon filaments are coated with silicon carbide is obtained. The coating, slightly crystallized, can be readily identified by x-ray diffraction. This coating perfectly matches the initial form of the filaments, which retain their individuality and all their suppleness. The thickness of the coating is constant and is of the order of 0.05 micron.

The mechanical characteristics of the filament thus treated are determined on twenty-millimeter specimens subjected to traction:

fracture stress $\overline{\sigma}F = 2,750$ MPa

Young's modulus: E=220 GPa By way of comparison, the same characteristics for the original strand are:

fracture stress $\overline{\sigma}F = 3,250$ MPa

Young's modulus: E=220 GPa

EXAMPLE 2

Example 1 is repeated with a gas reaction mixture obtained by entraining titanium tetrachloride vapor with hydrogen at 25° C. The hydrogen/chloride volume ratio is 59.6. The total gas flow rate is 8.7 liters per hour. The temperature of the substrate is regulated at 1,400° K.

After treatment, the filament obtained has a titanium carbide coating which can be identified by x-ray diffraction. The deposit has a uniform morphology. Its thickness is constant and is in the region of 0.03 microns. This thickness is the same over the length of a single filament and from one filament to another throughout the cross-section of the strand, in particular from the periphery as far as the core.

This mechanical characteristics of the coated filaments are:

fracture stress: $\overline{\sigma}F = 3,130$ MPa

Young's modulus: E=215 GPa

The teachings of the Warren and Carlson communication noted above were reproduced with a hydrogen/titanium halide molar ratio of the order of thirteen compared with sixty and more in the invention, a flow rate of the order of forty liters per hour, compared with about ten according to the invention, for a period of between thirty and one hundred and twenty minutes, compared with about one and a half minutes according to the invention.

A coating with a thickness of between 0.3 and 1.75 microns is obtained, and this makes the filaments very brittle and frequently adhering together. Furthermore and above all, during this treatment, titanium subhalides were deposited on all the cold walls of the enclosure. On the other hand, in the process according to the invention, practically no harmful deposit is formed on these walls.

The continuous process and the device according to the invention are perfectly adapted to the treatment of strands of carbon filaments, and it was not known how to do this hitherto. As already stated, this process makes it possible to produce deposits which are adherent, uniform, homogeneous, and of a thickness which is constant and between 0.01 and 0.1 micron over individual filaments which are not adhering together and, in this case as well, it was not known how to achieve this until now.

As a result, the strands of carbon filaments thus treated may be employed successfully for the fabrication of composite materials containing matrices of metals or of light alloys or of ceramics whose cost is markedly lower than for those reinforced with carbide silicon or boron fibers, optionally coated with boron or silicon carbide, while having mechanical or physicochemical characteristics which are comparable. As a result, this process may be employed successfully for the fabrication of composite materials intended for the aeronautics, space, nuclear and automotive industries, for sports equipment, and also robotics.

What is claimed is:

1. A strand of carbon filaments that is arranged so that each filament is separate from the other filaments and the filaments being in parallel alignment along the length of the strand, each filament containing a homogeneous and uniform carbide coating along its length that has a thickness of between 0.01 and 0.1 microns so that the filaments combine to form a supply strand, said coating being formed by heating the carbon filaments at atmospheric pressure in the presence of a carbon free volatile compound capable of reacting with each filament to produce a thin protective coating which prevents carbon from diffusing therethrough whereby the reaction is self-regulating.

2. The strand of claim 1 wherein the volatile compound contains an element selected from the group consisting of titanium, silicon, boron, tantalum, molybdenum, tungsten, hafnium and zirconium.

3. The strand of claim 1 wherein the volatile compound contains hydrogen and silicon tetrachloride, the hydrogen to silicon tetrachloride ratio is below 2.3, the reaction time is about one minute, the reaction pressure is atmospheric and the reaction temperature is between 1300° K. and 1800° K.

* * * * *